United States Patent
Yang et al.

[11] Patent Number: 6,137,123
[45] Date of Patent: Oct. 24, 2000

[54] HIGH GAIN GAN/ALGAN HETEROJUNCTION PHOTOTRANSISTOR

[75] Inventors: Wei Yang, Minnetonka; Thomas E. Nohava, Apple Valley; Scott A. McPherson, Eagan; Robert C. Torreano, Coon Rapids; Holly A. Marsh, St. Louis Park; Subash Krishnankutty, Minneapolis, all of Minn.

[73] Assignee: Honeywell International Inc., Morristown, N.J.

[21] Appl. No.: 09/376,114

[22] Filed: Aug. 17, 1999

[51] Int. Cl.[7] .................. H01L 31/0328; H01L 31/0336; H01L 31/072; H01L 31/109
[52] U.S. Cl. .................. 257/184; 257/185; 257/187; 257/462; 438/93
[58] Field of Search .................. 257/184, 185, 257/462, 187; 438/93

[56] References Cited

U.S. PATENT DOCUMENTS

| | | | |
|---|---|---|---|
| 4,614,961 | 9/1986 | Khan et al. | 357/30 |
| 4,985,742 | 1/1991 | Pankore | 357/34 |
| 5,093,576 | 3/1992 | Edmond et al. | 250/370.01 |
| 5,146,465 | 9/1992 | Khan et al. | 372/45 |
| 5,216,538 | 6/1993 | Twynam | 359/344 |
| 5,311,047 | 5/1994 | Chang | 257/198 |
| 5,399,880 | 3/1995 | Chand | 257/21 |
| 5,414,282 | 5/1995 | Ogura | 257/187 |
| 5,459,332 | 10/1995 | Carruthers | 257/17 |
| 5,677,538 | 10/1997 | Moustakas et al. | 250/370.12 |
| 5,679,965 | 10/1997 | Schetzina | 257/103 |
| 5,739,554 | 4/1998 | Edmond et al. | 257/103 |
| 5,834,331 | 11/1998 | Razeghi | 438/40 |
| 5,847,397 | 12/1998 | Moustakas | 250/370.06 |
| 5,889,296 | 3/1999 | Imamura et al. | 257/184 |

FOREIGN PATENT DOCUMENTS 41112172  4/1999  Japan .

OTHER PUBLICATIONS

Article: "Back–Illuminated GaN/AlGaN heterojunction photodiodes with high quantum efficiency and low noise", Wei Yang, et al. 1998 American Institute of Physics, accepted for publication Jun. 11, 1998, pp. 1086–1088.

*Primary Examiner*—William Mintel
*Attorney, Agent, or Firm*—John G. Shudy, Jr.

[57] ABSTRACT

A GaN/AlGaN heterojunction bipolar phototransistor having AlGaN contact, i-GaN absorbing, p-GaN base and n-GaN emitter layers formed, in that order, on a UV transparent substrate. The phototransistor has a gain greater than $10^5$. From 360 nm to 400 nm, eight orders of magnitude drop in responsivity was achieved. The phototransistor features a rapid electrical quenching of persistent photoconductivity, and exhibits high dark impedance and no DC drift. By changing the frequency of the quenching cycles, the detection speed of the phototransistor can be adjusted to accommodate specific applications. These results represent an internal gain UV detector with significantly improved performance over GaN based photo conductors.

26 Claims, 6 Drawing Sheets

HIGH GAIN GAN/ALGAN HETEROJUNCTION PHOTOTRANSISTOR

The Government may have rights in this invention pursuant to Contract No. F33615-95-C-1618, awarded by the Department of the Air Force.

BACKGROUND

The invention relates to photo detectors, and particularly to ultraviolet (UV) light photo detectors. More particularly, the invention pertains to phototransistors.

GaN-AlGaN based solid state ultraviolet (UV) photo detectors, sensitive to 200 nanometer (nm) to 365 nm UV radiation, have been actively sought for applications including solar-blind UV detection and flame sensing. Due to the direct band gap and availability of $Al_xGa_{1-x}N$ in the entire alloy composition range (0<x<1), GaN-AlGaN based UV detectors have the advantages of high quantum efficiency, tunability of cut-off wavelengths, and the capability of being fabricated as heterostructures. In recent years, GaN-AlGaN photo conductors and photo diodes of both Schottky and PIN junctions with good performance have been reported. However, the need for internal gain in UV detectors remains for low light level applications, in which photodiodes often can not produce adequate signal levels for the read-out electronics. Some attention has been given to avalanche photodiodes (APD) but very limited success has been indicated. Typically a high leakage current is incurred in a GaN p-n junction before it reaches avalanche breakdown, which is most likely due to the high defect density in III-nitride materials.

Photo conductors fabricated on certain undoped and Mg-doped GaN layers have shown high photo current gains. Such gains can be attributed to trapped charges (e.g., holes), that have very small recombination cross sections and give rise to unusually long electron lifetimes. Consequently, these devices exhibit persistent photoconductivity (PPC) after UV exposure. Furthermore, PPC or dark current in a GaN photoconductor drifts with temperature which makes direct current type (DC) measurements very difficult. These characteristics of photo conductors render them useful only in low speed AC mode operations.

In addition to the above problems, the gains in GaN photo conductors are essentially defect-related effects (i.e., traps giving long carrier lifetime), therefore are sensitive to the nature and density of the defects formed during the material growth. This gives rise to difficulties in producing consistent detector characteristics due to the fact that defect formation in GaN is not well understood and controlled. It is thus desirable to obtain internal gain based on more controllable and better understood processes.

DESCRIPTION OF THE EMBODIMENT

Figure 1:
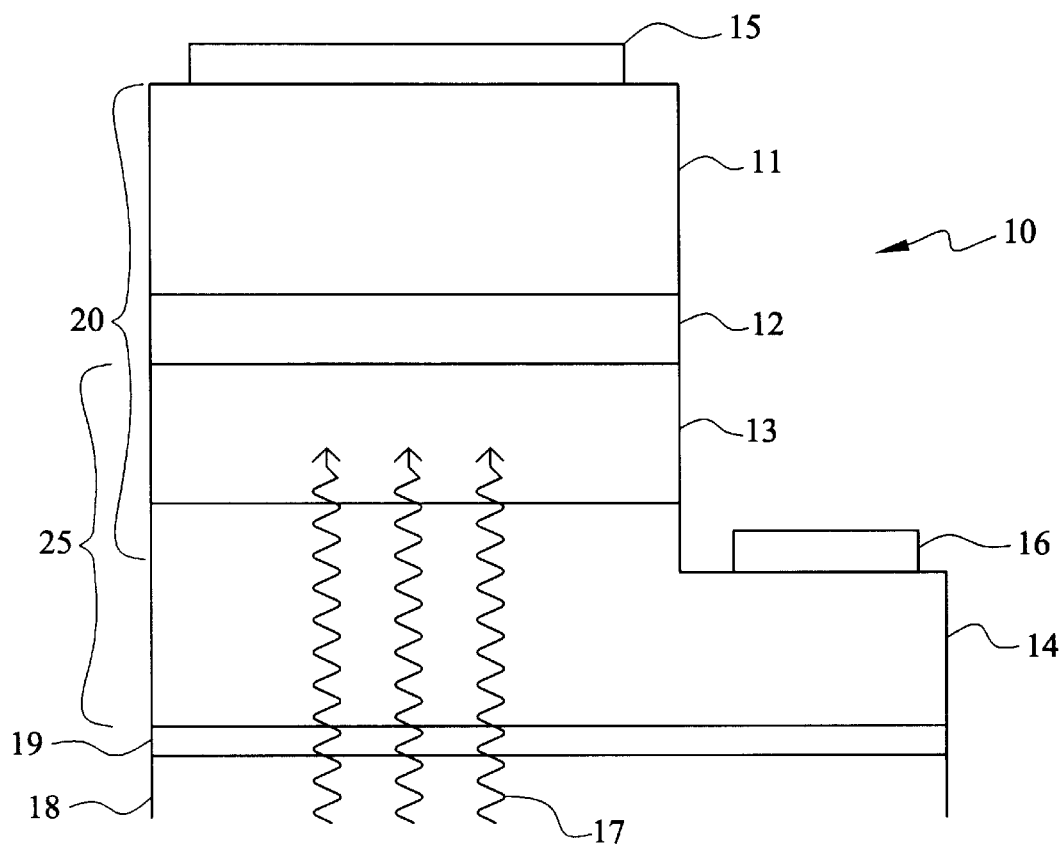
FIG. 1 shows a structure of the N-P-I-N GaN/AlGaN heterojunction bipolar phototransistor.

A GaN/AlGaN heterojunction bipolar phototransistor 10 is shown in FIG. 1. Phototransistor 10 is of an N-P-I-N configuration. Emitter 11 is a 0.5 micron thick layer of Si-doped n-GaN. The thickness of emitter layer 11 may range between 0.1 and 10 micron. The doping of layer 11 is about $10^{18}$ cm$^{-3}$, but may range between $10^{17}$ cm$^{-3}$ and $10^{21}$ cm$^{-3}$. Base 12 is a 0.2 micron thick layer of Mg-doped p-GaN. The thickness of base layer 12 may range between 0.05 and 2 microns. The Mg doping of layer 12 is about $10^{20}$ cm$^{-3}$, but may range between $10^{18}$ cm$^{-3}$ and $10^{21}$ cm$^{-3}$. Collector 25 consists of a 0.3 micron absorbing layer 13 of undoped GaN and a 1.7 micron thick transparent contact layer 14 of n-$Al_{0.2}Ga_{0.8}N$. The thickness of absorbing layer 13 may range between 0.1 micron and 2 microns. The thickness of contact layer 14 may range between 0.1 and 5 microns. Layer 14 is doped with Si at about $5\times10^{17}$ cm$^{-3}$, but the doping may range between $10^{16}$ cm$^{-3}$ and $10^{19}$ cm$^{-3}$. Layer 14 may be $Al_xGa_{(1-x)}N$ where x ranges between 0 and 0.5. Buffer layer 19 of between 5 and 100 nm is situated between layer 14 and substrate 18, and is used for initiating the crystal growth of the layers for phototransistor 10.

The compositions of the various layers of phototransistor 10 may have a variation of proportions of Al and Ga. Buffer layer 19 is $Al_xGa_{(1-x)}N$; contact layer 14 is $Al_yGa_{(1-y)}N$; absorbing layer 13 is $Al_zGa_{(1-z)}N$; base layer 12 is $Al_wGa_{(1-w)}N$; and emitter layer 11 is $Al_vGa_{(1-v)}N$. The ratios of the compositions of Al and Ga may fall in the ranges of $1 \geq x \geq y > z \geq 0$ and $0.5 \geq v \geq w \geq z \geq 0$.

The electrical contacts 15 and 16 are made to emitter 11 and the collector 25, respectively, and base 12 is left floating. Contacts 15 and 16 consist of sequentially deposited Ti and Al layers where the Ti layer is deposited first. The thicknesses of the Ti and Al layers in contact 15 and 16 are about 0.05 and 0.5 micron, respectively.

UV light 17 enters from the sapphire substrate 18 bottom surface and propagates through n-AlGaN layer 14, and is absorbed in undoped GaN layer 13. The substrate 18 thickness is about 350 microns but may range between 100 and 1000 microns. Other materials such as AlN, spinel ($MgAl_2O_4$), and ZnO may be used for substrate 18.

Figure 2:
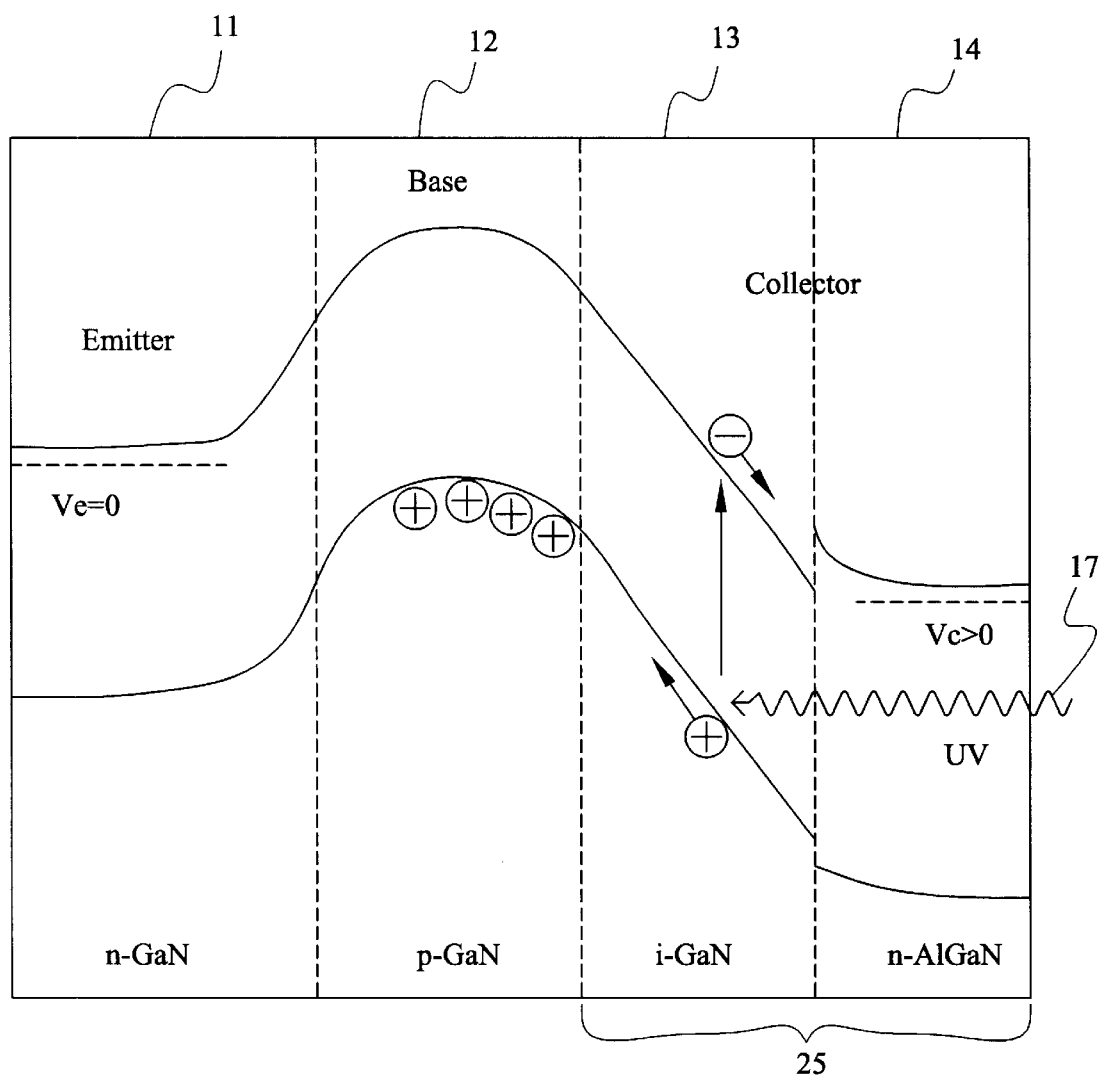
FIG. 2 is a band diagram of the GaN/AlGaN phototransistor.

The photo-generated electron-hole pairs are separated by the field in the i-GaN layer 13 region, and in which the electrons drift to collector 25 and the holes drift to base 12 (FIG. 2). The hole accumulation in the floating base 12 lowers the p-GaN base 12 barrier, and increases electron injection from emitter 11 and results in a current gain. The gain is determined by the electron transit time across base 12 and the hole trap time. In our floating-base device 10, the holes are not drained through a third terminal; therefore they are trapped in base 12 until they recombine with the injected electrons from emitter 11. While this recombination process is rather slow, an undesired persistent photoconductivity is expected. However, one can remove the trapped holes by biasing the detector to punch-through and force the holes into emitter 11, which quickly "reset" or quench detector 10. This useful functionality does not exist in GaN and AlGaN photo conductors.

Structure 10 was grown on a two-inch c-plane sapphire wafer in a low-pressure (10 to 76 torr) metal-organic chemical vapor deposition (MOCVD) reactor. Triethylgallium (TEG), triethylaluminum (TEA), and ammonia ($NH_3$) were used as precursors. A 25 nanometer (nm) AlN buffer layer 19 was grown at 625 degrees Celsius (C.) prior to the growth of the rest of structure 10 at 1050 degrees C. The phototransistor 10 fabrication was accomplished by a mesa 20 etching followed by n-type ohmic contacts 15 and 16 to emitter 11 and collector 13. For the mesa 20 etching, a reactive ion etch (RIE) was used with a 0.5 micron $SiO_2$ mask. For ohmic contacts 15 and 16, Ti/Al (50 nm/500 nm) was evaporated on n-GaN layer 11 and n-AlGaN layer 14, respectively, and annealed at 700 degrees C. for ten seconds in a rapid thermal annealer.

Figure 3:
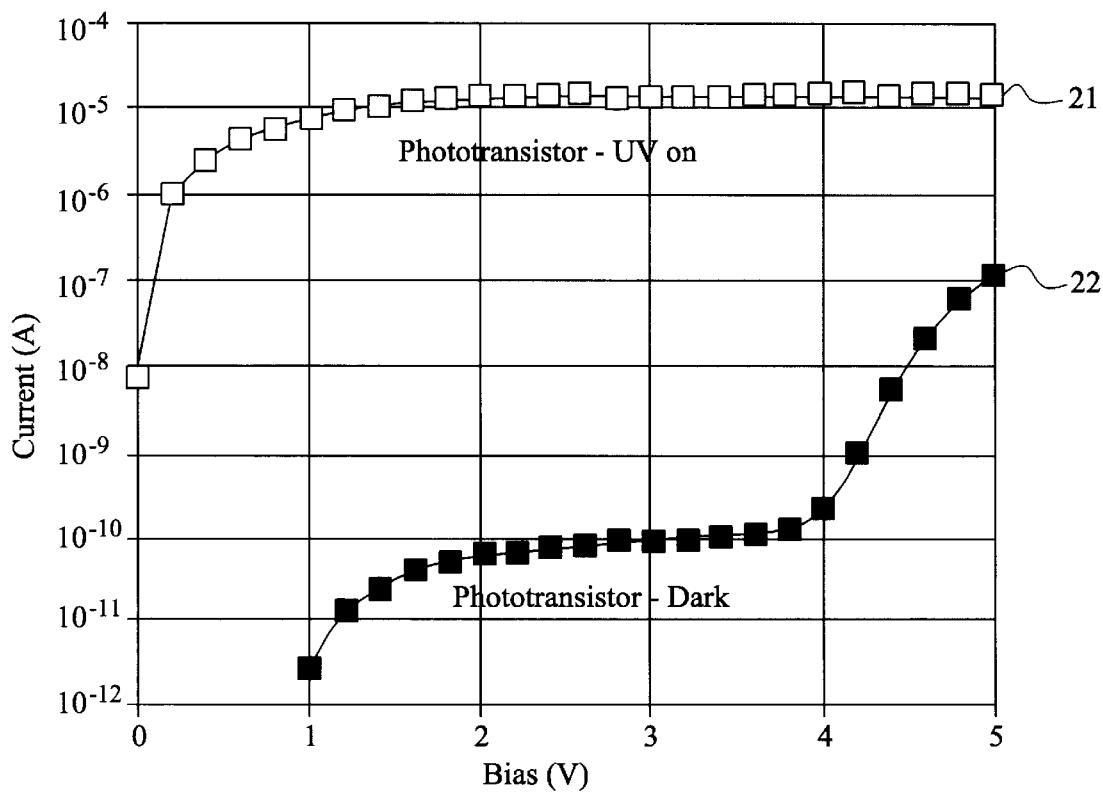
FIG. 3 reveals IV characteristics of the GaN/AlGaN phototransistor having less than a 0.05-mm square of active area.

The current-voltage (I–V) characteristics of phototransistor 10 with a 0.049 $mm^2$ active area under UV illumination 17 and dark conditions are shown in FIG. 3. Curves 21 and 22 were taken immediately after a 15-volt quenching bias was applied on collector 25. A low dark current 22 and a large photoresponse current 21 were observed under one- to four-volt collector 25 biases. Photoresponse 21 of the phototransistor is comparable to typical GaN photo conductors but the dark impedance is much higher. Without the quenching bias, however, phototransistor 10 exhibited persistent photoconductivity after UV 17 exposure and would not return to high dark impedance, which is similar to GaN photo conductors. The major advantage of phototransistor 10 over photo conductors is the new functionality that enables electrical quenching of the persistent photoconductivity. This allows phototransistor 10 to operate without PPC and DC drift and with much lower dark current. It also gives the flexibility to change the electrical bandwidth and gain of the detector required for specific applications.

Figure 4:
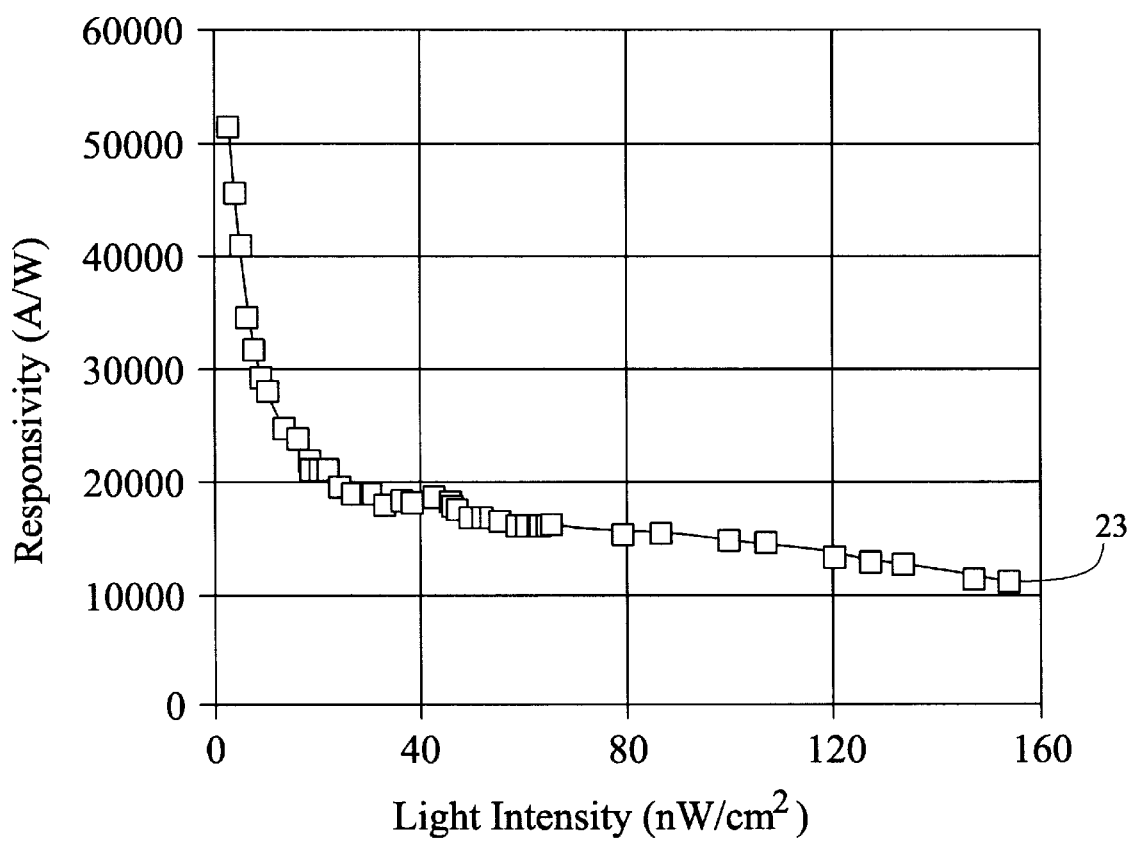
FIG. 4 is a graph showing responsivity as a function of light intensity measured using 359 nm UV and 10 Hz quenching frequency.

The responsivity measurement was performed under 10 Hz quenching-measuring cycles in which the device 10 was subject to a seven- to ten-volt pulse and then biased at three to four volts to measure photocurrent. In this scheme, the quenching frequency determines the electrical bandwidth and the gain of phototransistor 10, which roughly follow the constant gain-bandwidth product trade-off relationship. Light source 17 was a xenon lamp and a wavelength selecting monochromater calibrated with a UV enhanced Si phototransistor. The responsivity 23 as a function of light intensity is shown in FIG. 4. At 5 $nW/cm^2$, responsivity as high as $5 \times 10^4$ amperes/watt (A/W) was measured, corresponding to a quantum gain of $1.7 \times 10^5$. The decrease of responsivity 23 at higher intensities is due to reduced hole lifetime in base 12 caused by increased electron injection and therefore higher recombination rate. Spectral photoresponse 24 (in FIG. 5) shows a sharp long wavelength cut-off at 365 nm and a short wavelength cut-off at 315 nm. The 365-nm cut-off is due to photo-generation in i-GaN layer 13, and the 315-nm short wavelength cut-off is due to the absorption by the 1.7 micron $n-Al_{0.2}Ga_{0.8}N$ layer 14 collector 25.

Figure 5:
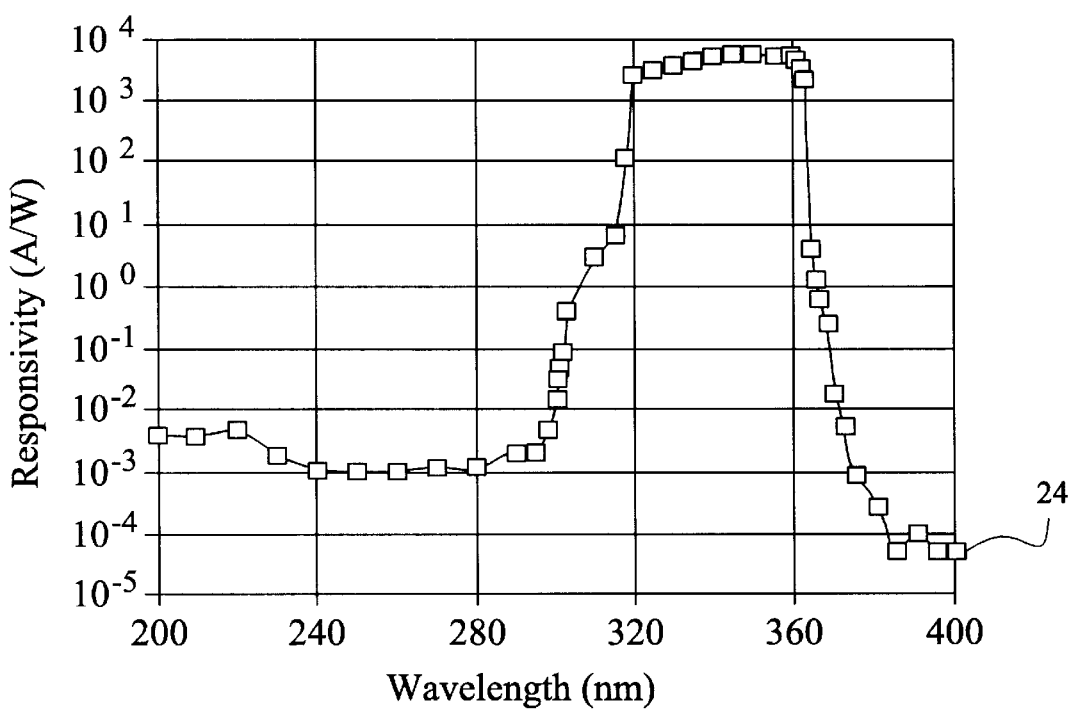
FIG. 5 indicates a spectral photoresponse of the GaN/AlGaN phototransistor showing a sharp cut-off at 365 nm and 8 orders of magnitude responsivity drop from 360 nm to 400 nm.
Figure 6A:
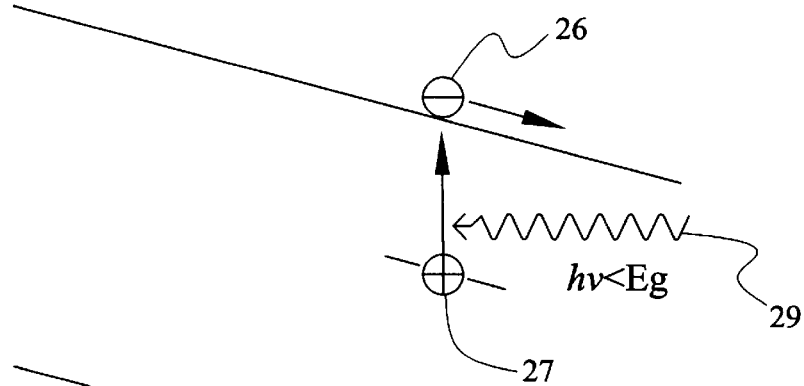
FIGS. 6(a) and 6(b) show a comparison of photoresponses for $h\nu<E_g$ in a photoconductor and a phototransistor.
Figure 6B:
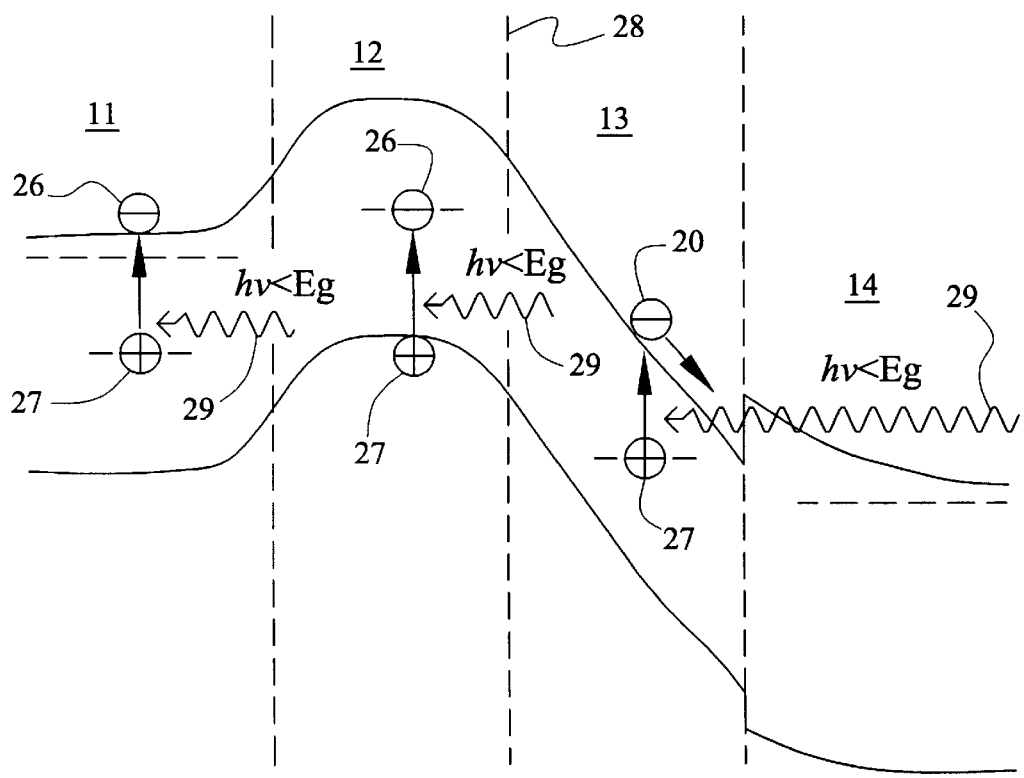

Despite the high gain in the UV region, phototransistor 10 exhibits an extremely small photoresponse at 400 nm and longer wavelengths. From 360 nm to 400 nm, an eight orders of magnitude drop in responsivity 24 was measured as shown in FIG. 5. This ratio is about four to five orders of magnitude higher than typical GaN photo conductors. An explanation to this improvement is illustrated in FIGS. 6a and 6b. The long wavelength response in photo conductors, as shown in FIG. 6a, is caused by transitions of electrons 26 from deep donor states to the conduction band by $h\nu < E_g$ photons 29 excitation. These transitions not only generate electrons 26 on the conduction band but also leave long-lived immobile charged gap states in the active region. Since the immobile charges 27 equally affect the potential in the active region as trapped holes, they contribute to the gain just as the trapped holes, even though the lifetime of the charged states may be different. Therefore in photo conductors the undesired $h\nu < E_g$ photoconductivity is substantially amplified.

In the phototransistor (FIG. 6b), the $h\nu < E_g$ photon 29 generated immobile charges 27 in the collector-base junction 28, or in emitter 11, can not drift to base 12, therefore they do not affect the base barrier height and thus contribute no gain. In addition, during the quenching bias (punch-through), many electrons 26 are injected into base 12 and collector 25, thus immediately after the quenching, most gap states in the undoped GaN region are filled with electrons 26. Therefore, $h\nu < E_g$ transitions from the valence band to these states are not likely. Finally, if $h\nu < E_g$ photons 29 are absorbed in p-GaN base 12, they can only produce holes and trapped electrons and add zero net charge to the base. Therefore, in GaN/AlGaN phototransistor 10, $h\nu < E_g$ photons 29 produce a much lower photocurrent than in a GaN photo conductor.

What is claimed is:

1. A phototransistor comprising:

a substrate;

a contact layer formed on said substrate;

an absorbing layer formed on said contact layer;

a base layer formed on said absorbing layer; and an emitter layer formed on said base layer.

2. The phototransistor of claim 1, wherein said emitter, base and absorbing layers form a mesa on said contact layer.

3. The phototransistor of claim 2, further comprising:

a first contact formed on said emitter layer; and a second contact formed on said contact layer.

4. The phototransistor of claim 3, further comprising a buffer layer situated between said substrate and contact layer.

5. The phototransistor of claim 3, wherein a phototransistor is a transistor having an N-P-I-N configuration, in the order of said emitter, base, absorbing and contact layers, respectively.

6. The phototransistor of claim 5, wherein said contact and absorbing layers form a collector of said transistor.

7. The phototransistor of claim 6, wherein:

said contact layer comprises AlGaN;

said absorbing layer comprises GaN;

said base layer comprises GaN; and said emitter comprises GaN.

8. The phototransistor of claim 6, wherein:

said contact layer comprises $Al_yGa_{(1-y)}N$;

said absorbing layer comprises $Al_zGa_{(1-z)}N$;

said base layer comprises $Al_wGa_{(1-w)}N$; and said emitter layer comprises $Al_vGa_{(1-v)}N$; and wherein $1 \geq y \geq z \geq 0$ and $0.5 \geq v \geq w \geq z \geq 0$.

9. The phototransistor of claim 8, wherein said phototransistor is for detecting light entering said phototransistor through said substrate.

10. The phototransistor of claim 9, wherein the light is of an ultraviolet wavelength.

11. The phototransistor of claim 10, wherein:

a thickness of said emitter layer is between 0.1 and 10 microns;

a thickness of said base layer is between 0.05 and 2 micron;

a thickness of said absorbing layer is between 0.1 and 2 microns; and a thickness of said contact layer is between 0.1 and 5 microns.

12. The phototransistor of claim 11, wherein:

said contact layer comprises $Al_xGa_{(1-x)}N$; and x is a value between 0 and 0.5.

13. The phototransistor of claim 12, wherein said substrate comprises a material from a group consisting of sapphire, AlN, spinel ($MgAl_2O_4$), and ZnO.

14. A phototransistor comprising:

substrate means for supporting the phototransistor and transmitting light to the phototransistor;

contact layer means, situated on said substrate means, for supporting a first electrical contact for the phototransistor and receiving light from said substrate;

absorbing layer means, situated on said contact layer means, for absorbing light from the contact layer means, and having a field that separates electron-hole pairs generated by the light;

floating base layer means, situated on said absorbing layer means, for accumulating holes that drift from said absorbing layer means; and emitter layer means, situated on said floating layer means, for injecting electrons to recombine with trapped holes of said floating base layer means, providing a second electrical contact for the phototransistor which is biased with respect to the first contact to force the trapped holes from said floating base layer means into said emitter layer means.

15. The phototransistor of claim 14, wherein a current gain of the phototransistor is determined by an electron transit time across said floating base layer means and a hole trap time.

16. A light sensitive phototransistor comprising:

a substrate light transmissive;

a collector situated on said substrate;

a base formed on said collector; and an emitter formed on said base.

17. The phototransistor of claim 16, wherein said collector comprises absorbing and contact layers.

18. The phototransistor of claim 17, wherein the phototransistor has an N-P-I-N doping configuration in the order of said emitter, base, and the absorbing and contact layers, in that order.

19. The phototransistor of claim 18, wherein:

said contact layer comprises n-AlGaN;

said absorbing layer comprises i-GaN;

said base comprises p-GaN; and said emitter comprises n-GaN.

20. The phototransistor of claim 19, wherein said substrate comprises a material from a group consisting of sapphire, AlN, spinel and ZnO.

21. A phototransistor for detecting radiation comprising:

a substrate transmissive to the radiation;

a contact layer formed on said substrate;

an absorbing layer formed on said contact layer;

a base layer formed on said absorbing layer and an emitter layer formed on said base layer.

22. The phototransistor of claim 21 further including a buffer layer transmissive to the radiation between the substrate and the contact layer.

23. The phototransistor of claim 22 wherein the radiation is ultraviolet light and the buffer layer contains aluminum and nitrogen.

24. The phototransistor of claim 21, wherein said emitter, base and absorbing layers form a single mesa on said contact layer.

25. The phototransistor of claim 24, further comprising a single first contact formed on said emitter layer; and a single second contact formed on said contact layer.

26. The phototransistor of claim 25 wherein a quenching bias is periodically applied between the first and second contacts.

* * * * *